United States Patent
Wan et al.

(10) Patent No.: US 9,706,269 B2
(45) Date of Patent: Jul. 11, 2017

(54) SELF-POWERED AND BATTERY-ASSISTED CMOS WIRELESS BIO-SENSING IC PLATFORM

(71) Applicant: Hong Kong Applied Science & Technology Research Institute Company Limited, Hong Kong (HK)

(72) Inventors: Ho Ming (Karen) Wan, Hong Kong (HK); Sze Wing Leung, Hong Kong (HK); Hok Mo Yau, Hong Kong (HK); Guang Jie Cai, Hong Kong (HK)

(73) Assignee: Hong Kong Applied Science and Technology Research Institute Company, Limited, Hong Kong (HK)

( * ) Notice: Subject to any disclaimer, the term of this patent is extended or adjusted under 35 U.S.C. 154(b) by 101 days.

(21) Appl. No.: 14/808,030

(22) Filed: Jul. 24, 2015

(65) Prior Publication Data

US 2017/0026723 A1 Jan. 26, 2017

(51) Int. Cl.
*H04Q 9/00* (2006.01)
*H04W 4/00* (2009.01)
(Continued)

(52) U.S. Cl.
CPC ............... *H04Q 9/00* (2013.01); *H03M 1/20* (2013.01); *H04B 5/0056* (2013.01);
(Continued)

(58) Field of Classification Search
None
See application file for complete search history.

(56) References Cited

U.S. PATENT DOCUMENTS

| 4,416,288 A | * | 11/1983 | Freeman | ............... A61B 5/0476 600/544 |
| 4,812,848 A | * | 3/1989 | Fry | ........................ H03M 1/60 341/124 |

(Continued)

FOREIGN PATENT DOCUMENTS

EP 2492831 A1 8/2012

OTHER PUBLICATIONS

Alminde, Oluf, "New integrated NFC tag/sensor devices: how low-cost, low-power RF technology enables new applications", AMS Technical Paper, Dec. 12, 2013.
(Continued)

*Primary Examiner* — Curtis King
*Assistant Examiner* — Chico A Foxx
(74) *Attorney, Agent, or Firm* — Stuart T. Auvinen; gPatent LLC

(57) ABSTRACT

A bio-sensing processor chip acts as an auto-configurable platform to support a wide variety of bio-sensors. Nanowires with attached bio-receptors for specific bio-molecules, ECG, and SPO2 bio-sensors drive analog voltages or currents to analog inputs of the bio-sensing processor chip. These analog inputs are divided into three sections. An input sensor detector/decoder detects which analog inputs are active and configures an analog-to-digital converter (ADC) to convert first-section inputs to 12 digital bits, second-section inputs to 16 bits, and third-section inputs to 20 bits. An Analog Front-End (AFE) is bypassed for the first section inputs but amplifies and filters second and third section inputs. A Universal Asynchronous Receiver Transmitter (UART) sends the converted digital values to a nearby external device using NFC or WiFi transmitters. When no battery is detected, energy is harvested from NFC signals
(Continued)

from the external device, and one-shot measurements are made.

18 Claims, 11 Drawing Sheets

(51) Int. Cl.
  *H04B 5/00* (2006.01)
  *H03M 1/20* (2006.01)
(52) U.S. Cl.
  CPC .......... *H04W 4/005* (2013.01); *H04W 4/008* (2013.01); *H04Q 2209/40* (2013.01); *H04Q 2209/886* (2013.01)

(56) References Cited

U.S. PATENT DOCUMENTS

| | | | | |
|---|---|---|---|---|
| 6,285,899 | B1* | 9/2001 | Ghaem | A61B 5/0002 128/903 |
| 6,529,127 | B2* | 3/2003 | Townsend | G01L 1/2256 340/10.1 |
| 6,535,156 | B1* | 3/2003 | Wang | H03M 1/14 341/120 |
| 6,643,541 | B2* | 11/2003 | Mok | A61B 5/0002 128/903 |
| 6,950,044 | B1* | 9/2005 | Piasecki | H03M 1/0872 341/118 |
| 7,208,077 | B1* | 4/2007 | Albers | G01N 27/3277 204/403.01 |
| 7,668,580 | B2* | 2/2010 | Shin | A61B 5/0416 600/372 |
| 7,943,970 | B2* | 5/2011 | Yoo | G01N 33/54373 257/252 |
| 7,969,307 | B2 | 6/2011 | Peeters | |
| 8,545,436 | B2* | 10/2013 | Robertson | A61B 5/0006 455/227 |
| 8,652,040 | B2* | 2/2014 | LeBoeuf | A61B 5/0059 600/301 |
| 8,818,481 | B2* | 8/2014 | Bly | A61B 5/0205 600/301 |
| 8,939,928 | B2* | 1/2015 | Savoie | A61M 5/14248 604/65 |
| 9,143,153 | B1* | 9/2015 | Tai | H03M 1/164 |
| 9,320,468 | B2* | 4/2016 | Hayter | A61B 5/14532 |
| 9,439,566 | B2* | 9/2016 | Arne | A61B 5/0022 |
| 2002/0026127 | A1* | 2/2002 | Balbierz | A61B 18/1206 600/567 |
| 2002/0149504 | A1* | 10/2002 | Hwang | H03M 1/129 341/139 |
| 2004/0027263 | A1* | 2/2004 | Pailleur | G06K 9/0002 341/141 |
| 2004/0236189 | A1* | 11/2004 | Hawthorne | G06F 19/3412 600/300 |
| 2005/0219108 | A1* | 10/2005 | Piasecki | H03M 1/124 341/163 |
| 2005/0261562 | A1* | 11/2005 | Zhou | A61B 5/0031 600/347 |
| 2006/0277420 | A1* | 12/2006 | Nguyen | G06F 1/263 713/300 |
| 2007/0010721 | A1* | 1/2007 | Chen | A61B 5/0002 600/300 |
| 2008/0024346 | A1* | 1/2008 | Kok | H03M 1/125 341/155 |
| 2009/0030293 | A1* | 1/2009 | Cooper | A61B 1/00016 600/302 |
| 2009/0149718 | A1* | 6/2009 | Kim | A61B 5/0006 600/300 |
| 2010/0100078 | A1* | 4/2010 | Say | A61B 5/1723 604/890.1 |
| 2010/0312188 | A1* | 12/2010 | Robertson | A61B 5/0006 604/156 |
| 2011/0109347 | A1* | 5/2011 | Rao | H03F 1/0222 327/63 |
| 2012/0242283 | A1* | 9/2012 | Kim | H02J 5/005 320/108 |
| 2013/0281807 | A1* | 10/2013 | Hayter | A61B 5/14532 600/347 |
| 2014/0017670 | A1* | 1/2014 | Yu | G01N 35/08 435/5 |
| 2014/0055291 | A1* | 2/2014 | Kimura | H03M 1/182 341/110 |
| 2015/0130628 | A1* | 5/2015 | Kyung | G01N 33/48792 340/870.02 |
| 2015/0204860 | A1* | 7/2015 | Chui | G01N 33/5438 506/9 |
| 2015/0260668 | A1* | 9/2015 | Alam | C25B 3/00 506/13 |
| 2015/0303975 | A1* | 10/2015 | Calhoun | H04B 1/1607 455/73 |
| 2016/0178568 | A1* | 6/2016 | Cheng | G01N 27/4148 257/253 |
| 2017/0018626 | A1* | 1/2017 | Hoffman | H01L 29/66045 |
| 2017/0119272 | A1* | 5/2017 | Gupta | A61B 5/04017 |

OTHER PUBLICATIONS

Huang et. al., "A Fully Integrated Hepatitis B Virus DNA Detection SoC based on Monolithic Polysilicon Nanowire CMOS Process", 2012 Symposium on VLSI Circuit Digests of Technical Papers, p. 124-125.
Timothy Swager, "Detecting gases wirelessly and cheaply", MIT News Offices, Dec. 8, 2014.
Cho et. al, "A Low Power Carbon Nanotube Chemical Sensor System", IEEE Circuits and Systems Conference, Sep. 2007, p. 181-184.
AMS, SL13A Datasheet, "Smart Sensory Tag Chip for Unique Identification, Monitoring and Data Logging", May 6, 2014.
Riebeseel et al., "BioMEMS for the electrochemical detection of troponin I", IEEE Sensors 2006, p. 160-161, Oct. 22, 2006.
Resende et al., "Assessment of the ST segment deviation area as a potential physiological marker of the acute myocardial infarction", IEEE EMBS, p. 669-672, Aug. 28, 2012.

* cited by examiner

SELF-POWERED AND BATTERY-ASSISTED CMOS WIRELESS BIO-SENSING IC PLATFORM

FIELD OF THE INVENTION

This invention relates to wearable computing, and more particularly to re-configurable bio-sensing chips.

BACKGROUND OF THE INVENTION

Semiconductor technology has allowed for very large, complex computing systems to be integrated onto a very small Integrated Circuit (IC). Power-supply voltages have also been reduced along with power consumption, allowing these IC's to be powered by a battery or even self-powered by harvesting energy from nearby radiation sources such as a Near-Field Communication (NFC) or Radio-Frequency Identification (RFID) transmitter.

Energy can be harvested using inductive coupling of RF signals. The distance between an RFID tag and reader (range) is limited to about 3 meters. Near-Field Communication (NFC) devices purposely limit the range to 20 cm for enhanced security. Users need to almost touch their NFC-enabled device such as a smartphone to a NFC reader to verify a NFC transaction.

More recently, Bluetooth Low-Energy (BLE) tags have been developed, along with the Bluetooth 4.0 protocol. Unlike passive RFID tags, BLE tags are powered by a low-energy source. Apple has further enhanced BLE tags to create iBeacons. iBeacons are powered by a low energy source such as a battery and thus have enough energy to periodically or continuously broadcast a packet to nearby devices. The range is up to 100 meters, but can be reduced by lowering the broadcast power. The broadcast packets are pushed from the iBeacon/BLE tag to nearby devices while data is pulled from passive RFID tags when energized by a RFID reader. RFID, BLE, and NFC co-exist because each has advantages and disadvantages that fit various specialized applications.

Device shrinkage and energy efficiency have enabled wearable computing. IC devices may be worn in clothing or attached to a person's skin with adhesive tape. Some may be disposable to increase hygiene. Various bio-sensors can be attached to the IC, allowing a person's biological signs to be sensed, such as heart rate, temperature, and respiration. Chemical sensors may detect very specific biochemicals, such as DNA markers, blood glucose, or various gases. Some sensors may operate only once when near a RF transmitter, performing a one-shot measurement without battery power. Other sensors may operate continuously on battery power. Some may use NFC, while others use RFID or BLE communication standards.

FIG. 1 shows a nano-wire bio-sensor. Nano-technology has produced specialized biological sensors. Nano-wire 110 is constructed by a semiconductor manufacturing process on silicon substrate 102. Silicon-dioxide (glass) layer 104 and silicon nitride Si3N4 layer 106 grown or deposited on silicon substrate 102.

Nano-wire 110 may be a thin polysilicon layer that terminates in source 114 and drain 112. Walls 116 form an opening to nano-wire 110 to allow chemicals from the environment, such as analytes 120 to reach nano-wire 110. Chemical receptors 118 are bonded onto Nano-wire 110. When analytes 120 bond to receptors 118, electrons are shifted either away from nano-wire 110 or into nano-wire 110, resulting in a reduction or an increase in free carriers within nano-wire 110. The effective resistance of nano-wire 110 thus changes when analytes 120 bond with receptors 118. This bonding may be a weak chemical bond or other kind of physical mechanism, but the change in resistance when analytes 120 are present can be measured when current is drawn between drain 112 and source 114. Silicon substrate 102 may act as a gate to bias nano-wire 110.

Nano-sensor 130 may sense a wide variety of specific chemicals, including large bio-chemicals, by the choice of chemical receptor 118. Four nano-wires 110 may be arranged into a bridge network between power and ground, with two differential sensor outputs from the intermediate nodes. Two of the four nano-wires in the bridge may be exposed to the environment and to any analytes 120, while the other two nano-wires are sealed and prevented from exposure to analytes 120. This bridge nano-wire network is especially sensitive.

A bewildering variety of proprietary IC devices have been developed for the many kinds of bio-sensors. A patient in a hospital may need to be wired up with dozens of sensors, each sensing a different bio-function or bio-chemical, using many different kinds of computing IC devices. These IC devices are often incompatible with each other even when the functions performed are similar. This redundancy of function is not just wasteful but also cumbersome and uncomfortable to the patient whom may have dozens or wires attached to him, making simple movement such as turning in bed difficult.

In the future, as the number of different kinds of bio-sensors expands, hospital patients may feel like a part of a machine as dozens of different kinds of wearable sensors and computing devices are attached. Some sensors may require very accurate multi-bit data conversion and processing, while other sensors may require less intensive data conversion and processing. Some sensors may require continuous monitoring and battery power, while others may sense infrequently and may be able to operate using energy harvesting to avoid using a battery or other power source. Some sensor devices may communicate results wirelessly, with others may require bulky wires.

Multi-sensors that can measures several biological signs at a time are desirable. Sensing multiple bio-signs is advantageous since a combination of results may better indicate a change in a patient's condition. The presence of certain chemical markers along with changes in vital signs may allow hospital staff to more quickly diagnose the patient. Disposable IC sensors can immediately report results without having to wait for laboratory testing. The amount of blood drawn from a patient may be dramatically reduced or eliminated, which may reduce patient fatigue from blood loss. Multi-sensors also have the advantage of reduced redundancy since circuits are shared among several bio-sensors. Redundant circuits are not just a waste of money, but add to the bulk of circuits and wires that the patient has to wear.

What is desired is a re-configurable bio-sensing computing device. A bio-sensing chip that can receive inputs from several different kinds of bio-sensors and automatically configure itself is desired. A multi-input, re-configurable bio-sensing IC chip is desired. A multi-use computing platform is desirable to support a variety of types of bio-sensors. A multi-input bio-sensor computing platform is desired to read inputs from multiple sensors rather than from just a single sensor, and to share computing resources and communication bandwidth among a number of bio-sensors. A re-configurable bio-sensing computing device that can operate both from battery power when available, and by energy harvesting from RF induction or coupling is also desired.

DETAILED DESCRIPTION

The present invention relates to an improvement in a re-configurable bio-sensing Integrated Circuit (IC). The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that a universal device for biological sensing could revolutionize the field of bio-sensing computing in much the same way that microprocessors accelerated advances in a wide variety computing applications. Microprocessor have generic hardware but specialized software. Bio-sensing processors use specialized hardware in the bio-sensors, but could use generic software.

While such a universal bio-sensing processor could be configured by firmware, the inventors have realized that the unique nature of bio-sensing could allow for auto-configuration based on the sensor inputs to the bio-sensing processor chip. Bio-sensing provides analog inputs to the bio-sensing processor chip. These analog inputs have different sensitivities, depending on the bio-sensor. Some bio sensors, such as for temperature, may produce an analog voltage that requires relatively few digital bits when converted, while other bio sensors, such as for an Electro Cardio Gram (ECG) are very precise analog voltages that require more digital bits to preserve the analog voltage accuracy.

Figure 1:
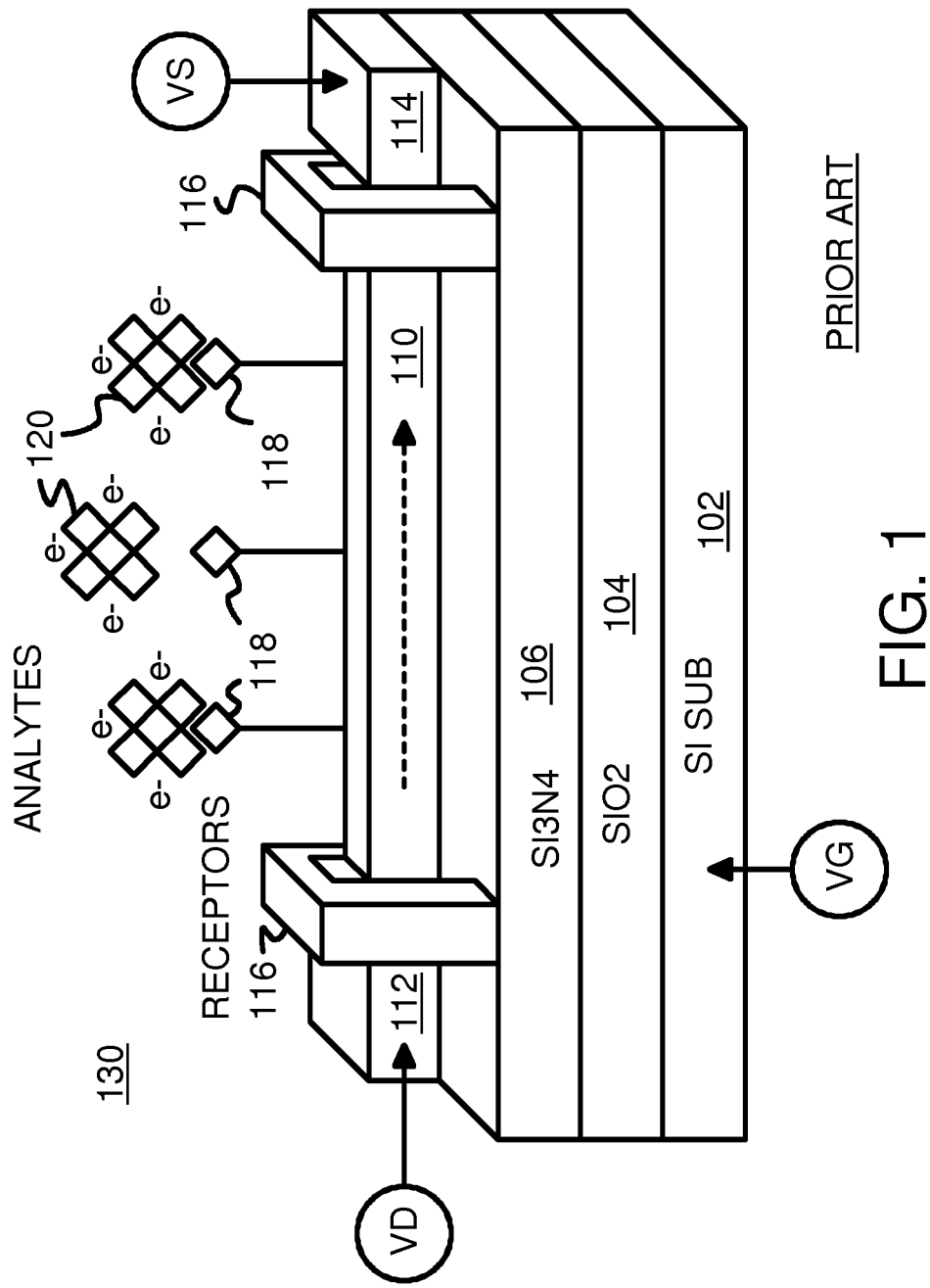
FIG. 1 shows a nano-wire bio-sensor.
Figure 2:
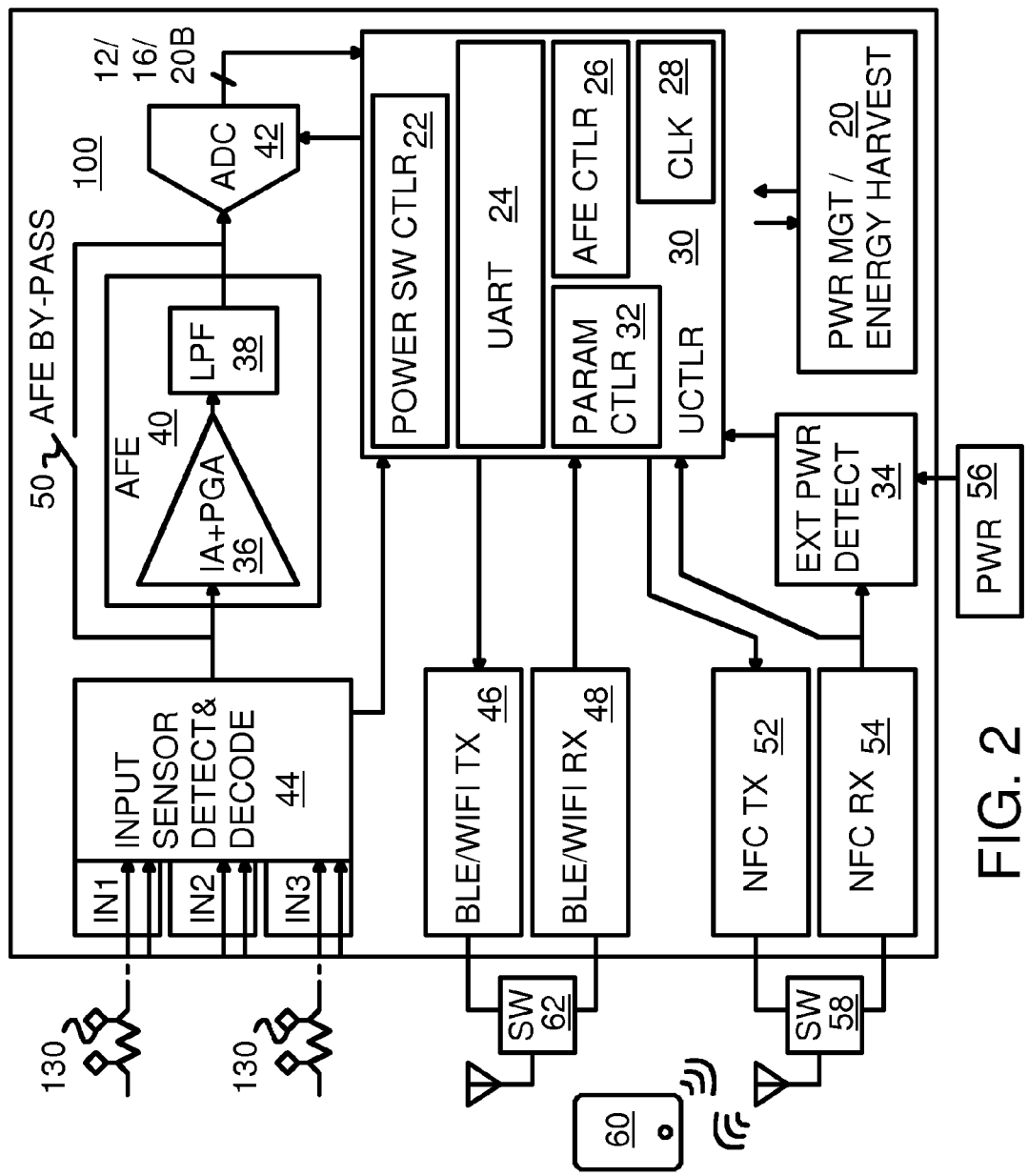
FIG. 2 shows a bio-sensing processor chip.

FIG. 2 shows a bio-sensing processor chip. The inventors have developed a bio-sensing processor chip that has many analog inputs from various kinds of bio-sensors. The chip's inputs are divided into three groups or sections. Each section has a different sensitivity or resolution. Coarse bio-sensors 130 are attached to section 1 inputs IN1 to input sensor detector/decoder 44. These sensors have less accuracy and their analog signals can be converted by analog-to-digital converter (ADC) 42 into a 12-bit digital value. Also, amplification and pre-conditioning of the coarse analog signal is not needed, so by-pass switch 50 is closed to bypass Analog Front End (AFE) 40.

Precise bio-sensors 130 are more sensitive, and generate more precise analog signals. Precise bio-sensors 130 are attached to section 3 inputs IN3 to input sensor detector/decoder 44. These bio-sensors have high precision and their analog signals are converted by ADC 42 into a more precise 20-bit digital value. Amplification and pre-conditioning by AFE 40 improves analog signal quality before conversion by ADC 42. By-pass switch 50 is open for section 2 and section 3 inputs IN2, IN3.

Input sensor detector/decoder 44 also receives inputs from the second section, IN2. When input sensor detector/decoder 44 detects an active input attached to IN2, an input that is not grounded and has a varying analog voltage, this IN2 input is periodically sampled and applied to amplifier 36 in AFE 40. Amplifier 36 has an initial amplifier and a programmable-gain amplifier and drives low-pass filter 38. The amplified and filtered analog signal from AFE 40 is then converted to a 16-bit digital value by ADC 42 for IN2 inputs. Analog signals may be voltage or current sensed.

Input sensor detector/decoder 44 detects which analog inputs are active and which are grounded, and reports which inputs and in which sections are active to microcontroller 30. Microcontroller samples each of the detected analog inputs, one at a time, activating input sensor detector/decoder 44 to select one of the active inputs and apply it to AFE 40. AFE controller 26 configures ADC 42 for the proper number of bits of conversion. By-pass switch 50 is also closed for first section inputs to bypass AFE 40. Once one analog input from input sensor detector/decoder 44 has been converted and stored by microcontroller 30, then the next analog input from input sensor detector/decoder 44 can be processed, until all analog inputs have been sampled, converted, and stored. Then microcontroller 30 can loop back and perform sampling and conversion on all the active inputs again.

Bio-sensing processor chip 100 automatically configures itself based on which analog inputs to input sensor detector/decoder 44 are active. Inactive inputs are grounded by the system designer. The system designer merely has to connect his particular bio-sensors 130 to one of the three inputs sections IN1, IN2, IN3, depending on the precision level of bio-sensor 130. Specialized firmware or software for the particular bio-sensors attached is not needed, although it could be used.

The converted samples sent by ADC 42 to microcontroller 30 may be stored in a local memory (not shown) and then sent off-chip using Universal Asynchronous Receiver Transmitter (UART) 24, which formats the digital sample values from ADC 42 as a serial stream to be transmitted by BLE/Wifi transmitter 46 or by NFC transmitter 52 to external device 60. Clock module 28 generates a clock to UART 24 and to other components to synchronizer transfers and operation.

Commands from external device 60 are sent wirelessly using NFC protocols to NFC receiver 54. Antenna switch 58 isolates NFC transmitter 52 from the antenna when NFC receiver 54 is receiving data from the antenna. Commands from external device 60 may also be sent wirelessly using BLE or Wifi protocols to BLE receiver 48. Antenna switch 62 isolates BLE transmitter 46 from the antenna when BLE receiver 48 is receiving data from the antenna. Parameter controller 32 stores the NFC transceiver's analog parameters such as TX/RX gain control, filter adjust, charge pump level control etc. and sets the information accordingly.

External power detector 34 detects when an external battery or power source has been attached. When external power source 56 is present, external power detector 34 activates power switch controller 22 to power all blocks in bio-sensing processor chip 100 from external power source 56. This is battery mode. However, when external power source 56 is not present, bio-sensing processor chip 100 operates in self-powered mode. When external device 60 is in close proximity and transmitting using NFC, power manager and energy harvester 20 can generate a power-supply voltage from the NFC transmission receive by NFC receiver 54. This self-generated power may have only enough energy to perform one measurement, or one-shot measurement, where the analog inputs to input sensor detector/decoder 44 are converted to digital values only once, and then the one value per analog input is sent to external device 60 before external device 60 is moved away.

Power manager and energy harvester 20 can control power consumption by turning off certain blocks when not in use. For example, power manager and energy harvester 20 can disable NFC transmitter 52 and NFC receiver 54 to conserve power when a WiFi device has been connected and BLE transmitter 46 and BLE receiver 48 have connected to a longer-range external device 60.

Figure 3:
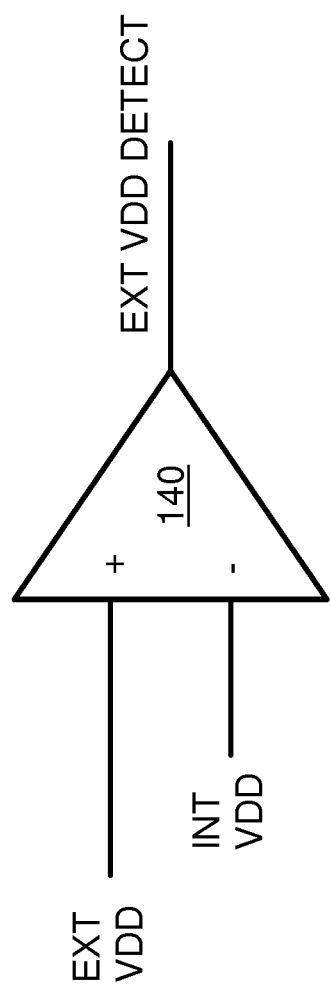
FIG. 3 shows an external battery power detector.

FIG. 3 shows an external battery power detector. External power detector 34 (FIG. 2) can use comparator 140 to determine when external power source 56 is present or absent. The voltage of the VDD pad that should be connected to external power source 56, EXT_VDD, is compared to the internal VDD voltage, INT_VDD. When an external battery is present as external power source 56, EXT_VDD is higher in voltage than INT_VDD, so comparator 140 drives EXT_VDD_DETECT high to signal that external power source 56 has been detected. Power manager and energy harvester 20 can then disable energy harvesting from the NFC signal and enter battery mode.

When no external battery is present, EXT_VDD will be grounded or at a very low voltage. The internal VDD will be using harvested energy from the NFC receiver, so INT_VDD will be above ground. Comparator 140 will drive EXT_VDD_DETECT low, causing power manager and energy harvester 20 to continue harvesting NFC energy to drive the internal VDD. Bio-sensing processor chip 100 uses self-powered mode.

Figure 4:
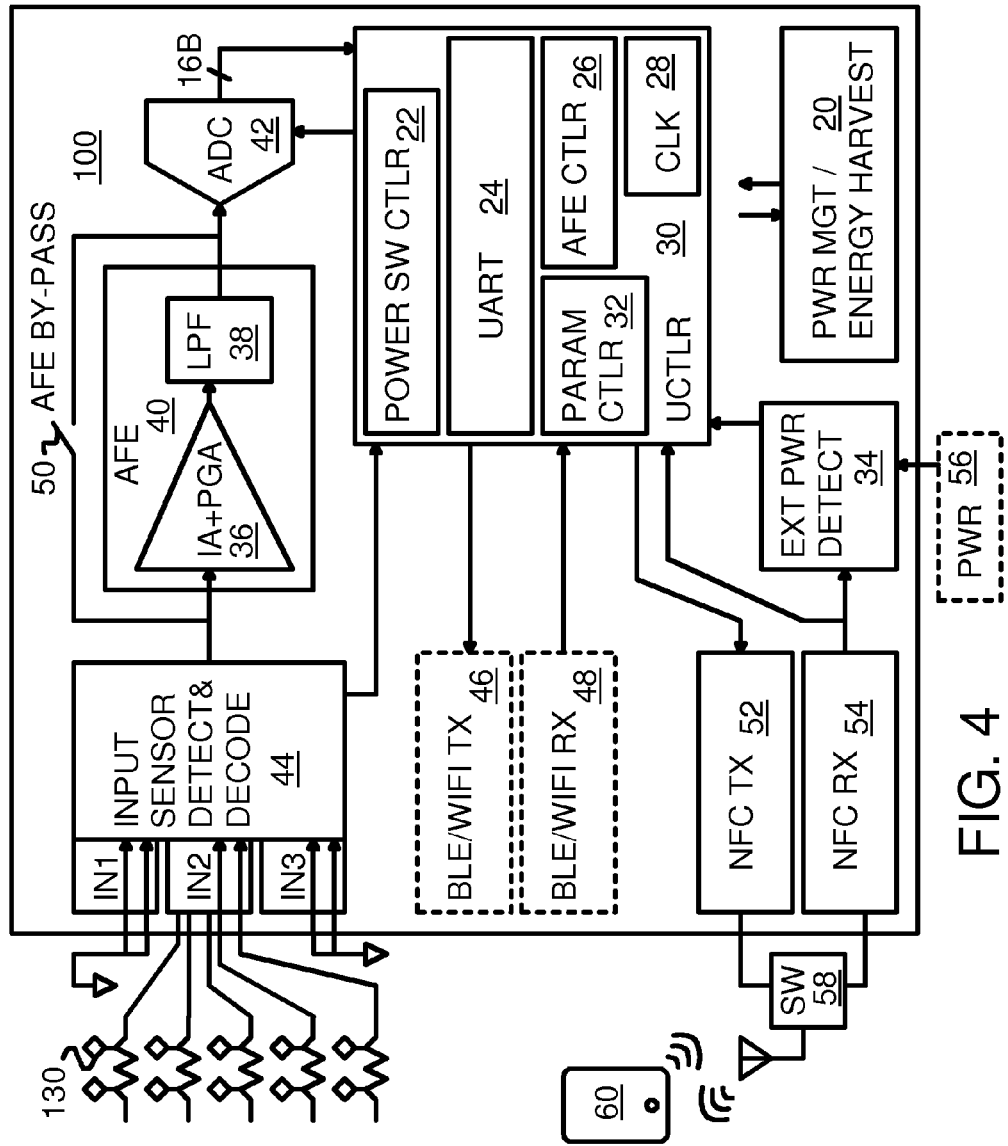
FIG. 4 shows the bio-sensing processor chip configured as a self-powered disease detector.

FIG. 4 shows the bio-sensing processor chip configured as a self-powered disease detector. Bio-sensors 130 are nano-detectors that detect various proteins and markers for one or more diseases. For example, five different markers may be used to detect auto-immune type 1 diabetes. These markers include Glucose, Islet Cell Cytoplasmic Autoantibodies (ICA), Glutamic Acid Decarboxylase Autoantibodies (GADA), Insulinoma-Associated-2 Autoantibodies (IA-2A), and Insulin Autoantibodies (IAA). In this example, five bio-sensors 130 are connected to five inputs in section 2, IN2. The other inputs IN1, IN3 are grounded. Input sensor detector/decoder 44 detects that five inputs are active in section 2, and informs microcontroller 30. AFE controller 26 configures ADC 42 to perform 16-bit conversion of the analog samples. AFE 40 is enabled and AFE by-pass switch 50 is open.

External power detector 34 determines that external power source 56 is not present, so battery mode is not available. Instead, energy is harvested from the NFC signals from external device 60 that are received by NFC receiver 54. Power manager and energy harvester 20 can power down and BLE transmitter 46 and BLE receiver 48 during self-powered mode.

NFC energy may need to be accumulated and stored for a period of time, such as by a power capacitor (not shown). Once sufficient energy has been harvested, microcontroller 30 can activate AFE 40 and ADC 42 to convert each of the five analog inputs from bio-sensors 130. Then UART 24 can convert these samples to a digital stream that is transmitted to external device 60 through NFC transmitter 52. Once external device 60 receives all 5 digital values for all five samples, external device 60 can be moved away, causing power loss in bio-sensing processor chip 100, which is then powered off.

In this application, bio-sensing processor chip 100 is used to measure several different disease markers or chemicals. Bio-sensing processor chip 100 and bio-sensors 130 can be located in a disposable or wearable patch. No battery is needed since power is harvested from the NFC radiation from external device 60. Disease detection is enhanced since multiple markers are tested for at about the same time while external device 60 is held near bio-sensing processor chip 100. The combination of three, four, or five of the markers being present increases the disease diagnosis accuracy compared with measuring only one or two markers. There are no delays while samples are sent to a lab for traditional lab testing. Instead, results can be displayed immediately by software running on external device 60 once the analog measurements from bio-sensors 130 are converted to digital and transmitted from bio-sensing processor chip 100.

Figure 5:
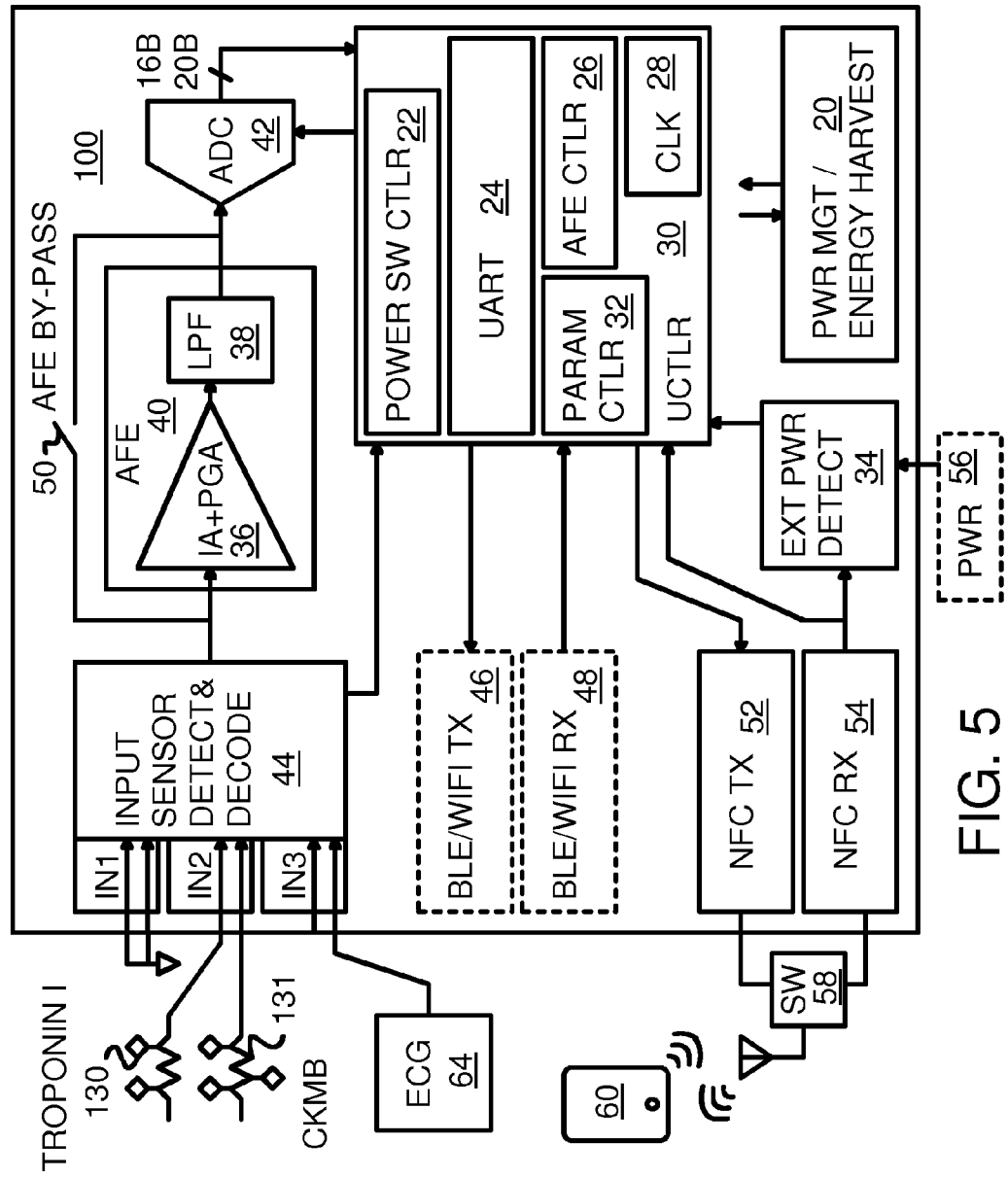
FIG. 5 shows the bio-sensing processor chip configured as a self-powered heart attack or stroke detector.

FIG. 5 shows the bio-sensing processor chip configured as a self-powered heart attack or stroke detector. Bio-sensors 130 is a nano-detector that detects troponin I, while bio-sensor 131 detects creatine-kinase (CK-MB). Both are markers for myocardial injury that can be caused by a heart attack or stroke. Troponin is a much more sensitive indicator, but confirmation with CK-MB can increase confidence in a diagnosis.

ECG 64 are sensors that measure electrical signals from the heart. These are time-varying electrical signals and require greater accuracy, so ECG 64 is connected to a section 3 IN3 analog input, while bio-sensors 130, 131 are connected to section 2 IN2 analog inputs. Section 1 inputs IN1 are grounded.

Input sensor detector/decoder 44 detects that two inputs are active in section 2, and one input is active in section 3, and informs microcontroller 30. When bio-sensors 130, 131 are being sampled, AFE controller 26 configures ADC 42 to perform 16-bit conversion of the analog samples. AFE 40 is enabled and AFE by-pass switch 50 is open. When ECG 64 is being sampled, AFE controller 26 configures ADC 42 to perform 20-bit conversion of the analog ECG sample. AFE 40 is still enabled and AFE by-pass switch 50 remains open.

External power detector 34 determines that external power source 56 is not present, so battery mode is not available. Energy is harvested from the NFC signals from external device 60 that are received by NFC receiver 54. Power manager and energy harvester 20 powers down and BLE transmitter 46 and BLE receiver 48 during self-powered mode.

Once sufficient energy has been harvested, microcontroller 30 activates AFE 40 and ADC 42 to convert the analog inputs from bio-sensors 130, 131 and from ECG 64. UART 24 converts these samples to a digital stream that is transmitted to external device 60 through NFC transmitter 52. Once external device 60 receives all 3 digital values, external device 60 can be moved away, causing power loss in bio-sensing processor chip 100, which is then powered off. However, the nurse or technician may keep external device 60 in proximity for a longer period of time to get more samples of ECG 64 over a longer period of time, so that these samples can be displayed in a graph over several heart-beat periods to time.

In this application, bio-sensing processor chip 100 is used to measure two different cardiac disease markers as well as an ECG. Bio-sensing processor chip 100, bio-sensors 130, 131, and ECG 64 can be located in a disposable or wearable patch. No battery is needed since power is harvested from the NFC radiation from external device 60. Cardiac event detection is enhanced since multiple markers are tested for at about the same time as the ECG is taken while external device 60 is held near bio-sensing processor chip 100. The combination of two bio-markers being present increases the disease diagnosis accuracy compared with just the ECG. Early and accurate detection of a stroke or heart attack is critical to patient survival since morbidity increases with time until treatment is administered.

Figure 6:
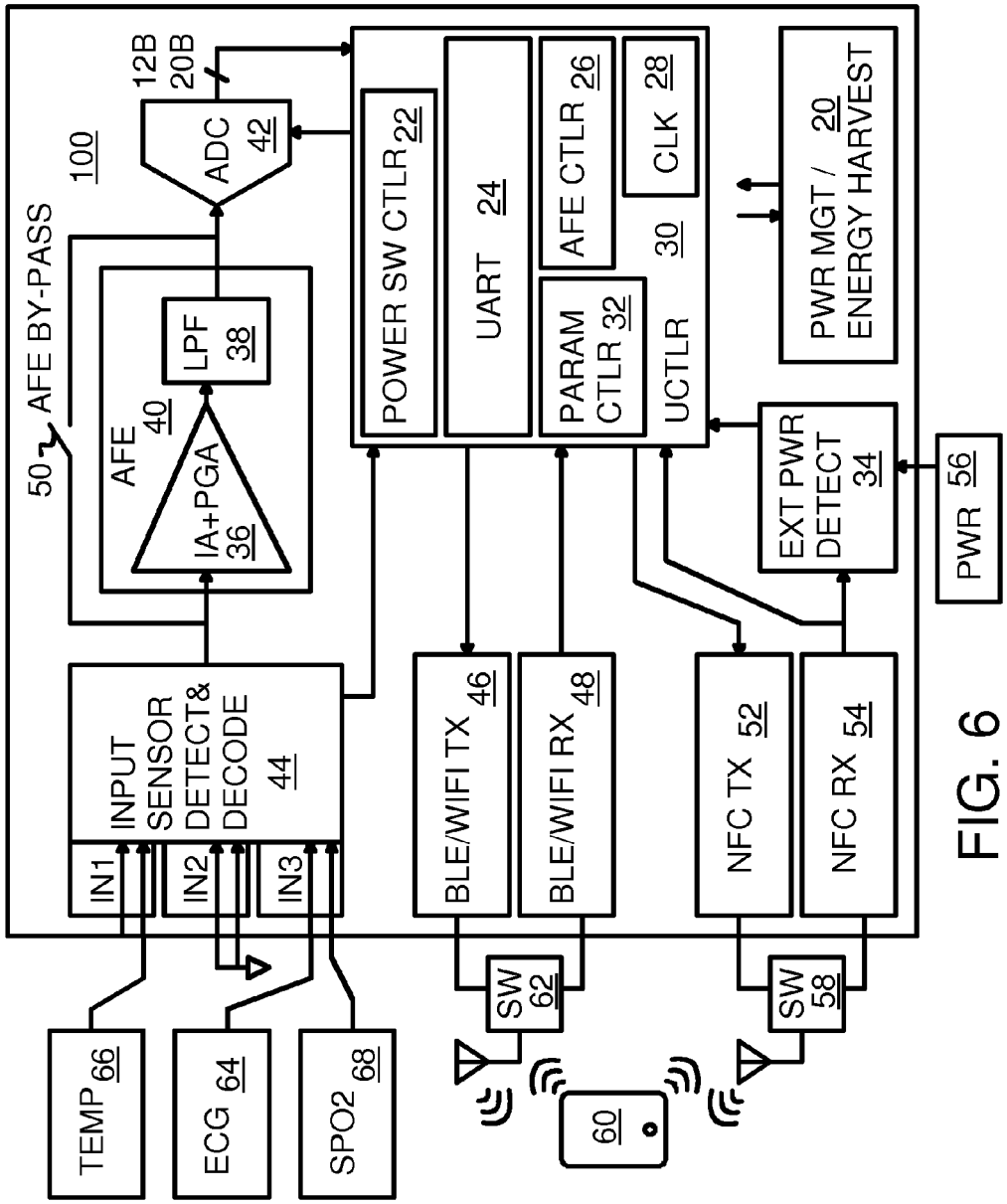
FIG. 6 shows the bio-sensing processor chip configured as a vital signs monitor.

FIG. 6 shows the bio-sensing processor chip configured as a vital signs monitor. Temperature monitor 66 is connected to a section 1 IN1 input, while ECG 64 and SPO2 monitor 68 are connected to section 3 IN3 analog inputs, Section 2 inputs IN2 are grounded. SPO2 monitor 68 measures peripheral capillary oxygen saturation, a measure of oxygen in the bloodstream.

Input sensor detector/decoder 44 detects that two inputs are active in section 3, and one input is active in section 1, and informs microcontroller 30. When temperature monitor 66 is being sampled, AFE controller 26 configures ADC 42 to perform 12-bit conversion of the analog samples. AFE 40 is disabled and AFE by-pass switch 50 is closed to bypass AFE 40. When ECG 64 or SPO2 monitor 68 are being sampled, AFE controller 26 configures ADC 42 to perform 20-bit conversion of the analog ECG or SPO2 sample. AFE 40 is still enabled and AFE by-pass switch 50 remains open.

Vital signs are often monitored continuously, so battery power is used. External power detector 34 determines that external power source 56 is present, so battery mode is signaled. Power manager and energy harvester 20 disables energy harvesting.

Periodically, microcontroller 30 activates AFE 40 and ADC 42 to convert the analog inputs from temperature monitor 66, ECG 64, and SPO2 monitor 68. UART 24 converts these samples to a digital stream that is transmitted to external device 60 through NFC transmitter 52. Once external device 60 has been paired with bio-sensing processor chip 100, external device 60 can be moved farther away, and BLE transmitter 46 and BLE receiver 48 used. NFC transmitter 52 and NFC receiver 54 can be powered off by power manager and energy harvester 20.

In this application, bio-sensing processor chip 100 is used to continuously measure three vital signs. Bio-sensing processor chip 100, a battery, temperature monitor 66, ECG 64, and SPO2 monitor 68 can be located in a disposable or wearable patch, or the monitors can be connected to bio-sensing processor chip 100 by wires if the monitors are not co-located.

Figure 7:
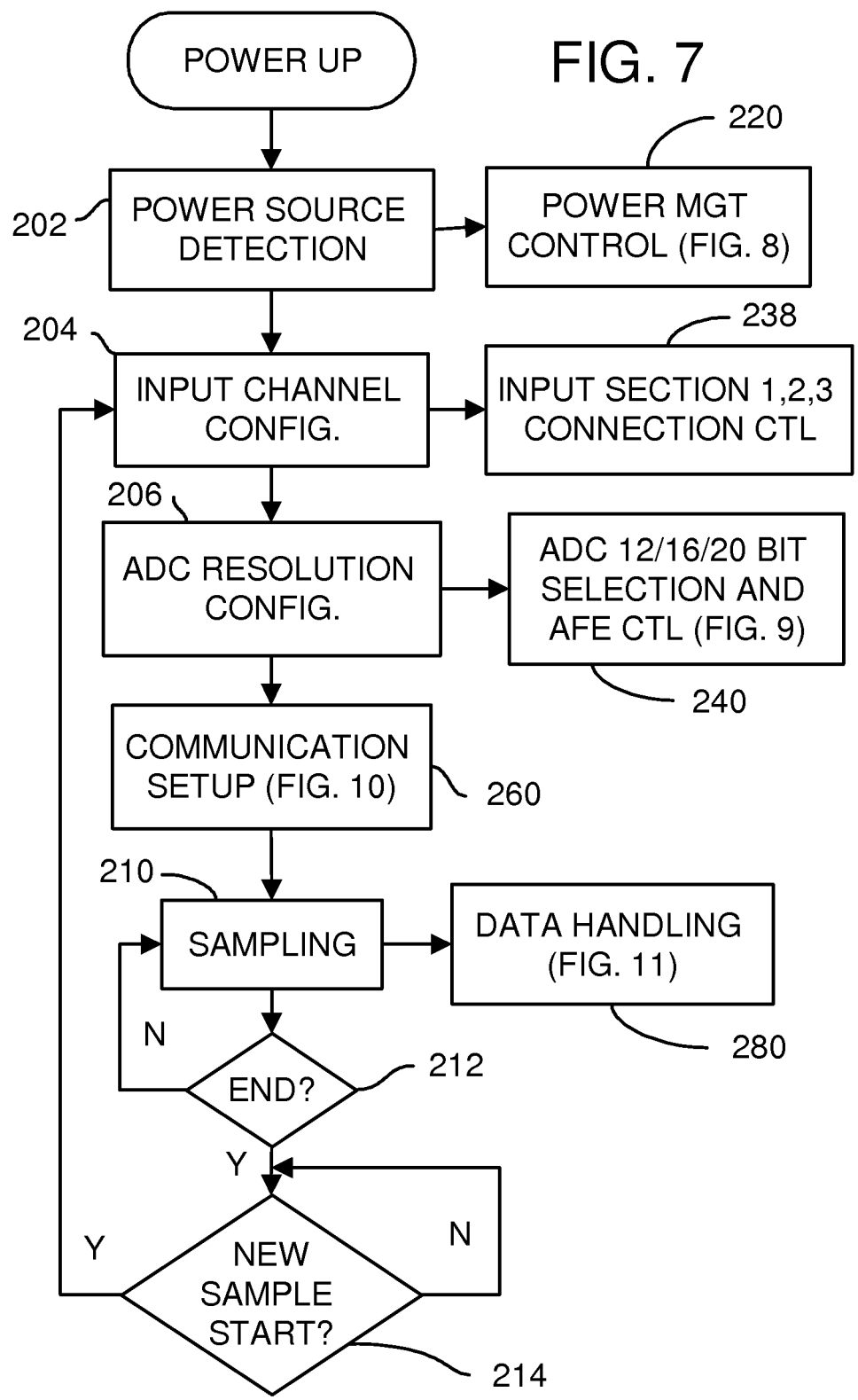
FIG. 7 is a flowchart of overall operation of the bio-sensing processor chip.
Figure 8:
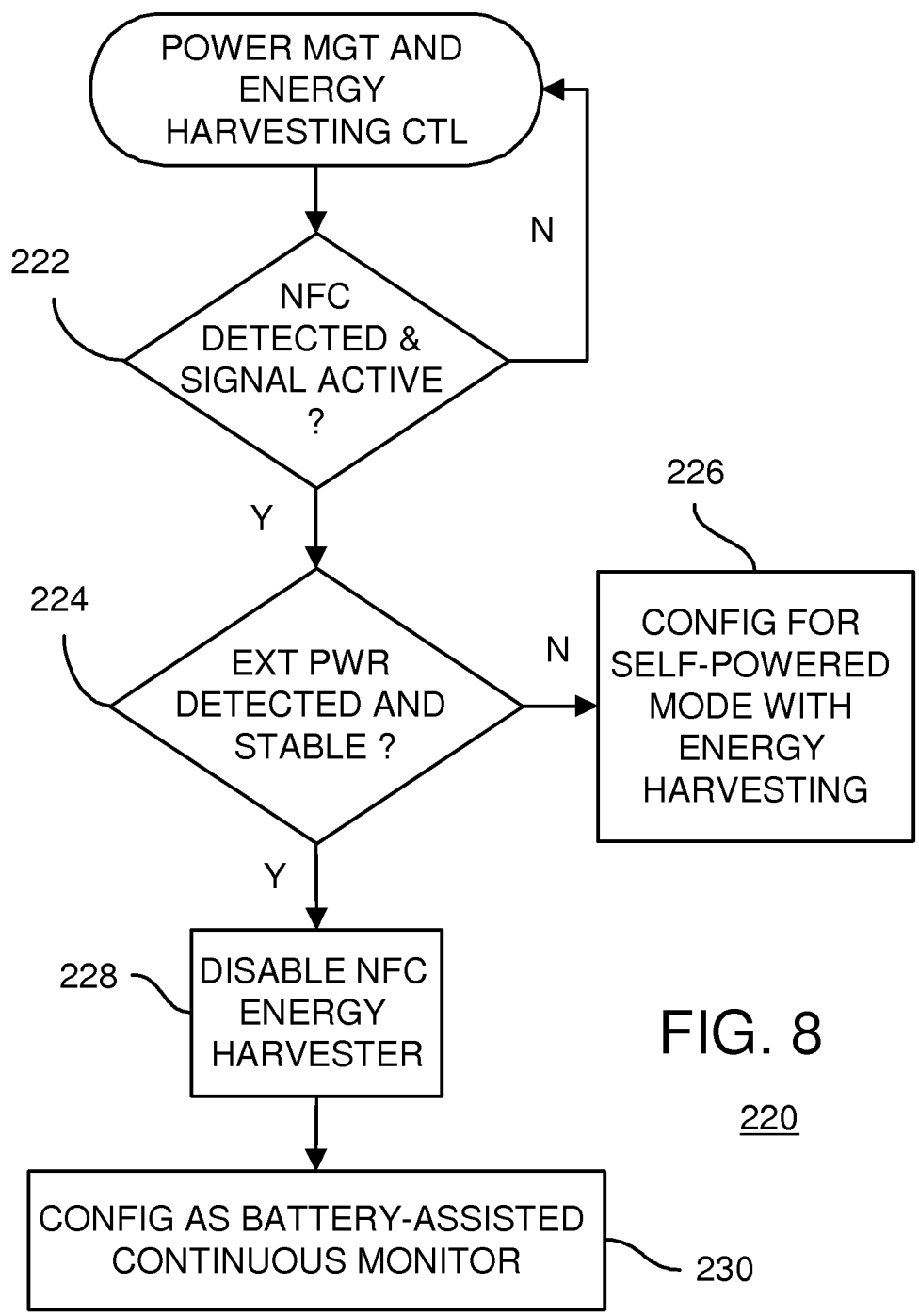
FIG. 8 is a flowchart of a power management control process.

FIG. 7 is a flowchart of overall operation of the bio-sensing processor chip. When initialized or power is applied, the power source is detected, step 202. Power management control process 220, shown in more detail in FIG. 8, is activated.

The bio-sensing processor chip configures itself based on which analog inputs are active. Input channel configuration 204 activates input section connection control routine 238 to detect which inputs are active and which are inactive or grounded. A report of which analog inputs are active in each of the three sections is reported to the microcontroller.

The ADC is configured for each of the three sections with active inputs, step 206. ADC resolution selection routine 240 (FIG. 9) is called.

Figure 10:
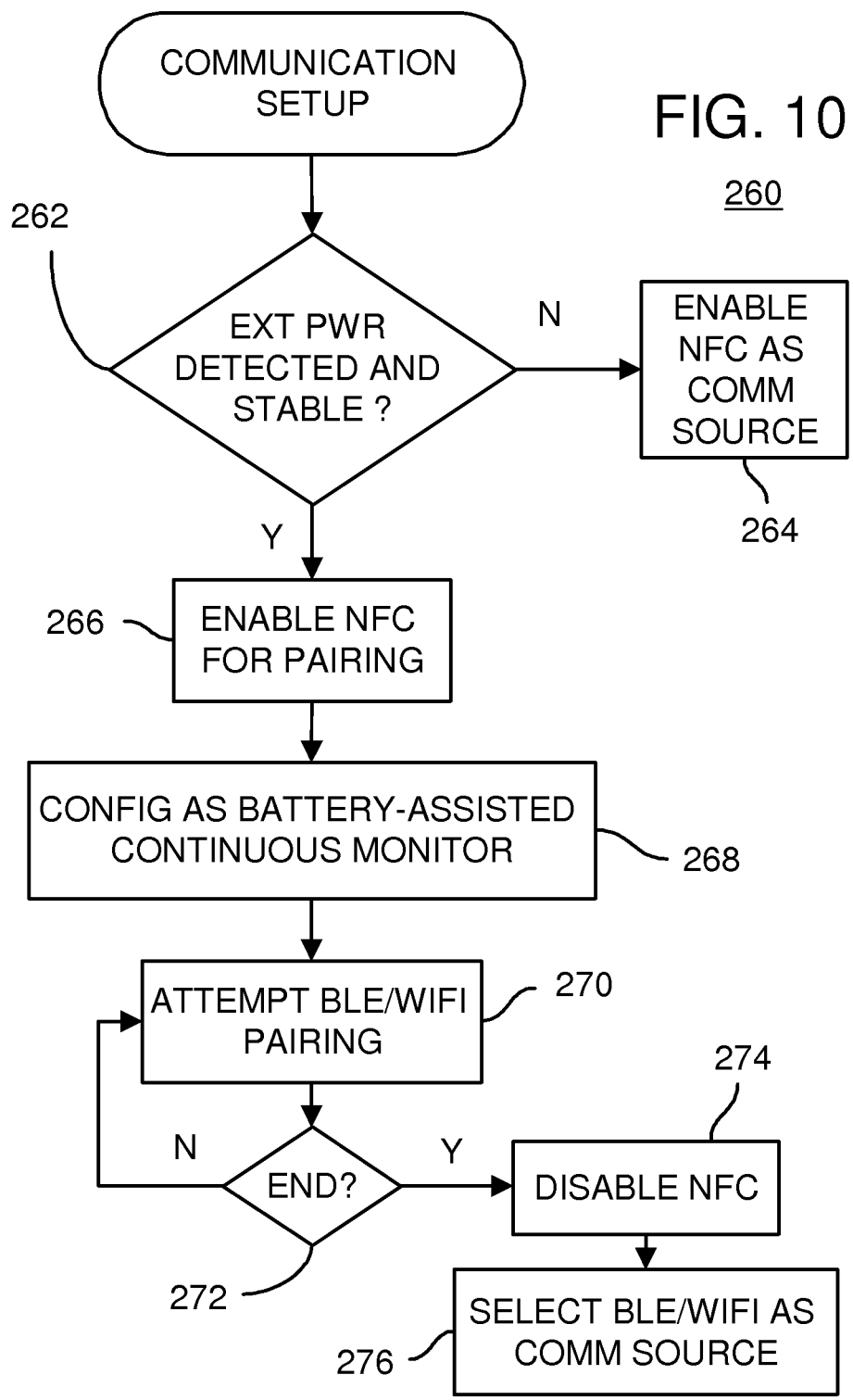
FIG. 10 is a flowchart of a communications setup routine.

The communication channel to external device 60 is setup, using communications routine 260, shown in FIG. 10.

The bio-sensing processor chip is now ready to sample its analog inputs. During sampling step 210, each of the active analog inputs is sampled and converted to a digital value, until all inputs have been sampled, step 212. The digital values are sent to the external device using data handling routine 280, shown in FIG. 11.

Only one set of measurements may be performed when auto-powered mode is active. However, if a battery is present, or if sufficient energy has been harvested, another round of sampling can be initiated, step 214. The channels are again configured, the ADC resolution set, and communication with the external device adjusted if necessary, steps 204, 206, 260, before the next sample is taken, step 210.

When the external device is moved away, and no battery is present, the bio-sensing processor chip loses power and waits until power can again be harvested and the process re-initializes.

FIG. 8 is a flowchart of a power management control process. Power management control process 220 is activated at power up. When no NFC signal is detected, step 222, then external device 60 is not nearby, and results cannot be reported. Once an NFC signal is detected, step 222, then external power detector 34 checks the VDD pad voltage to determine if an external battery or other power source is available, step 224. External power detector 34 can check the external VDD voltage several times to ensure than a stable voltage is present.

When no external power source is detected, step 224, then the bio-sensing processor chip is configured for self-powered mode, step 226. The energy harvesting circuit is enabled to power the bio-sensing processor chip from the NFC radiation. Only one set of measurements is made (one-shot).

When a stable external power source is detected, step 224, then the energy harvesting circuit is disabled, step 228. The bio-sensing processor chip is configured for battery mode, step 230. Continuous monitoring of the analog inputs is performed.

Figure 9:
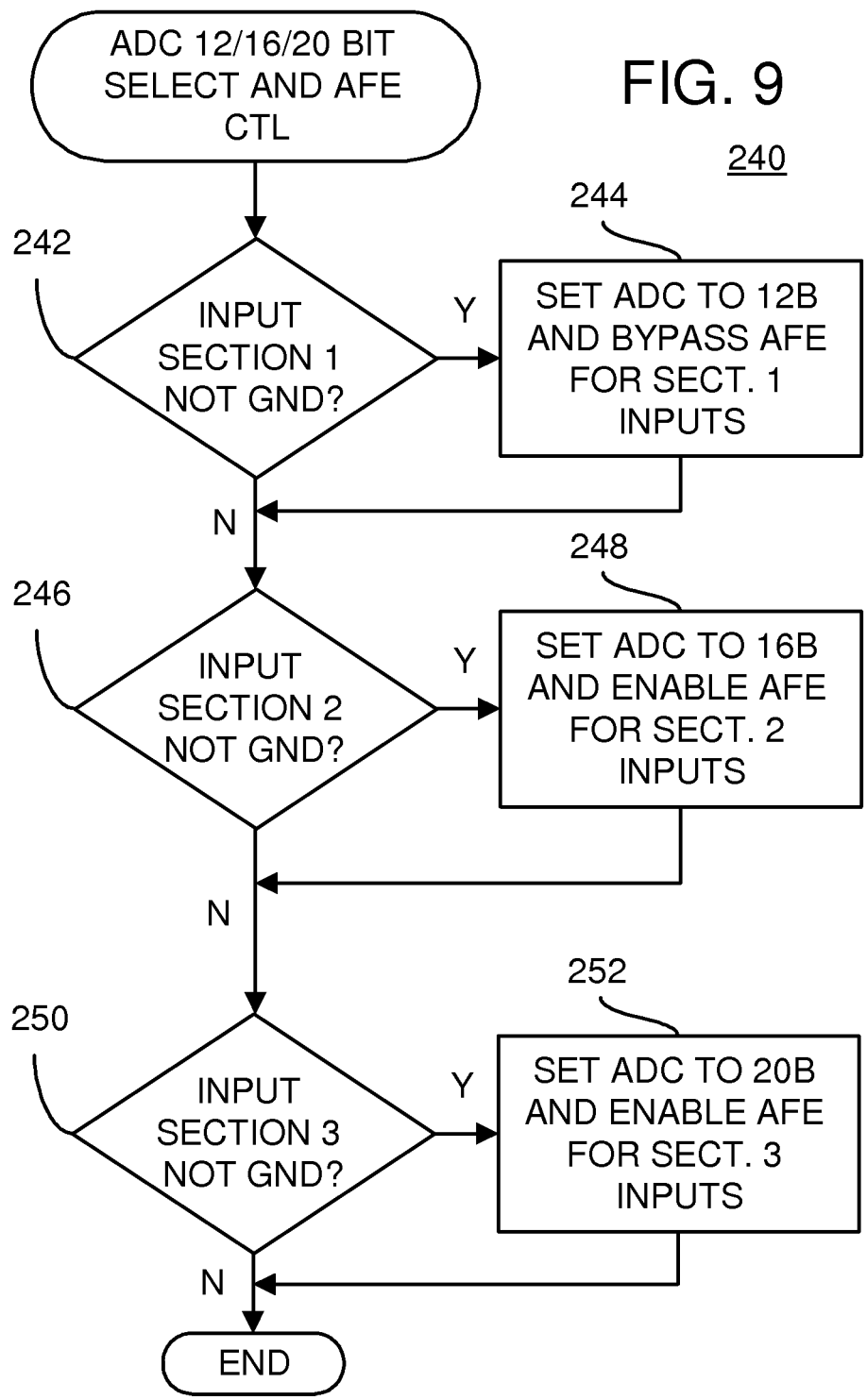
FIG. 9 is a flowchart of an ADC resolution routine.

FIG. 9 is a flowchart of an ADC resolution routine. ADC resolution selection routine 240 is performed at each power-up before analog inputs are sampled. When input sensor detector/decoder 44 determines that at least one IN1 input in section one is not grounded, step 242, then ADC 42 is set to 12-bit conversion and AFE bypass switch 50 is closed to bypass AFE 40 when inputs from section 1 are sampled and converted, step 244.

When input sensor detector/decoder 44 determines that at least one IN2 input in section two is not grounded, step 246, then ADC 42 is set to 16-bit conversion and AFE bypass switch 50 is open and AFE 40 is enabled when inputs from section 2 are sampled and converted, step 248.

When input sensor detector/decoder 44 determines that at least one IN3 input in section three is not grounded, step 250, then ADC 42 is set to 20-bit conversion and AFE bypass switch 50 is open and AFE 40 is enabled when inputs from section 3 are sampled and converted, step 252.

FIG. 10 is a flowchart of a communications setup routine. Communications routine 260 is performed after power-on, or when communications parameters have changed. When external power detector 34 determines that no external battery or power is available, step 262, then NFC is set as the communications source, step 264, since the bio-sensing processor chip is operating in self-powered mode and relies on NFC radiation for energy harvesting. A single set of measurement, conversion, and transmission is performed (one-shot) due to the limited power.

When an external battery is detected, step 262, then the NFC transceiver is enabled to allow for device pairing, step 266. Since battery power is available, the bio-sensing processor chip is configured for continuous monitoring, step 268.

BLE receiver 48 is activated to search for a WiFi signal from external device 60. When a WiFi signal is obtained, BLE transmitter 46 attempts pairing with external device 60, step 270. One pairing is successful, step 272, NFC transmitter 52 and NFC receiver 54 are disabled to save battery power, step 274. BLE/WiFi is selected as the communication channel to external device 60, step 276.

Figure 11:
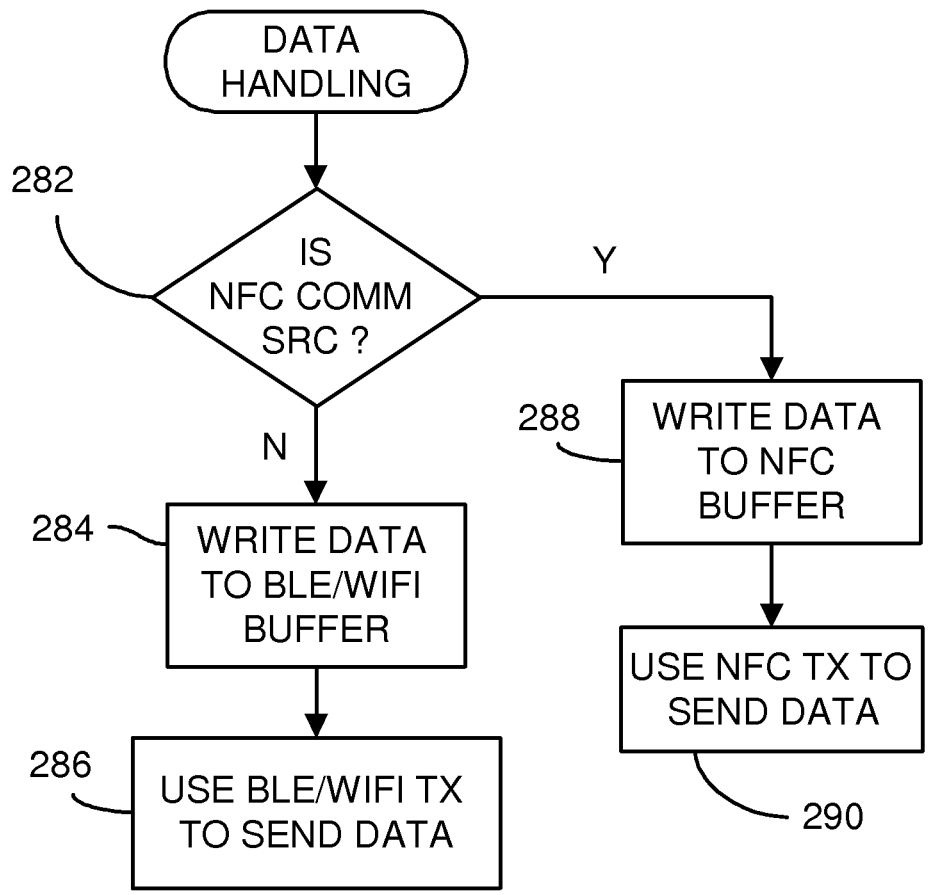
FIG. 11 is a flowchart of a data handling routine.

FIG. 11 is a flowchart of a data handling routine. Data handling routine 280 is called when an analog sample has been converted and sent to UART 24. When NFC is set as the communication source, step 282, then UART 24 writes the converted digital values and any added formatting, headers, or checksums in the bit stream from UART 24 to a transmit buffer in NFC transmitter 52, step 288. NFC transmitter 52 is then activated to send the data in its buffer to the external device, step 290.

When NFC is not set as the communication source, step 282, then UART 24 writes the converted digital values and any added formatting, headers, or checksums in the bit stream from UART 24 to a transmit buffer in BLE/Wifi transmitter 46, step 284. BLE/WiFi transmitter 46 is then activated to send the data in its buffer to the external device, step 290.

ALTERNATE EMBODIMENTS

Several other embodiments are contemplated by the inventors. For example, various communications protocols and standards could be used for both near-field and far-field wireless communications. The processes shown in FIGS. 7-11 may be performed by microcontroller 30 using combinations of hardware gates, firmware routines, specialized communications processors and controllers, UART's, etc. Some steps may be performed simultaneously with other steps, or sequences may be adjusted and varied. Pipelining of steps is also possible.

Additional channels could be added. The number of analog inputs per section could be fixed, such as 3 analog inputs per section, 5 analog inputs per section, etc., or could be configurable. Analog inputs could be a single-ended input or could each be a differential input. Voltage or current sensing could be used on the analog inputs. Power management may power-down various blocks when not in use to save power, and may lower the internal power supply voltage to various blocks, or reduce clock rates to conserve energy.

Latches, flip-flops, registers, and sample-and-hold circuits may be added at various points to stored digital values or analog voltages or charges. Many kinds of ADC's could be used, such as flash converters, switched capacitor converters, successive-approximation converters, sigma-delta converters, incremental converters, etc. The number of digital bits converted could vary form the examples shown for the 3 sections. There may be more than 3 inputs sections, or only 2 inputs sections. The gain of the PGA may be adjusted for the different input sections, as could the filter. Other kinds of amplifiers and filters could be used in AFE 40, such as trans-impedance amplifiers, instrumentation amplifiers, etc.

Conversion of analog inputs could be prioritized, such as when energy harvested is limited. Some analog inputs may be sampled and converted at a high rate than other analog inputs. Power manager and energy harvester 20 may also include power-on-reset circuits, reference circuits, and various comparators or amplifiers. Charge pumps, voltage regulators, reference circuits, voltage limiters, and analog comparators may be incorporated into the system. Transmitter power may be reduced in NFC transmitter 52 or in BLE/Wifi transmitter 46 to save energy.

The bio-sensing processor chip may include one or more bio-sensors 130 on the same substrate or within a multi-chip package. The bio-sensing device may be wearable, disposable, an implant under the skin, taped to the skin, held in place with an elastic band, or using many other possible mounts. Many kinds of monitors with many combinations of sensors may be developed using the bio-sensing processor chip, using either battery power or self-powered energy harvesting.

While a mobile or external device such as a smart phone has been described, other kinds of mobile devices could be substituted, such as smart watches, wearable computers, tablets, automobile computers and networked devices, other smart communication devices. Protocols may be enhanced. Functions may be implemented on different layers of software or firmware than described earlier. Messages passed between the bio-sensing processor chip and the external device may then be sent to a host or backend server or website.

UART 24 may support a variety of transmission protocols, such as Inter-Integrated Circuit (I$^2$C), Serial Peripheral Interface (SPI), etc. The routines of FIGS. 7-11 can be executed by microcontroller 30, external power detector 34, and other hardware components of bio-sensing processor chip 100. The wireless transmitter and receiver could be combined into a transceiver. Bio-sensing processor chip 100 may be manufactured with a standard complementary metal-oxide-semiconductor (CMOS) process, or variations of CMOS processes, or using other processes.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A bio-sensing processor chip comprising:
a plurality of analog inputs that receive analog signals generated by bio-sensors that sense biological functions or molecules;
a first section of the plurality of analog inputs, the first section of the plurality of analog inputs receiving analog signals representing coarse measurements;
a second section of the plurality of analog inputs, the second section of the plurality of analog inputs receiving analog signals representing average-resolution measurements that have a higher precision than the coarse measurements;
a first bio-sensor having a nano-wire with receptors bonded thereon for detecting a first biological molecule, the first bio-sensor driving one of the inputs in the second section of the plurality of analog inputs;
a second bio-sensor having a nano-wire with receptors bonded thereon for detecting a second biological molecule, the second bio-sensor driving another one of the inputs in the second section of the plurality of analog inputs;
a third section of the plurality of analog inputs, the third section of the plurality of analog inputs receiving analog signals representing fine measurements that have a higher precision than the average-resolution measurements;
an input sensor detector/decoder that detects connected inputs in the plurality of analog inputs, the connected inputs being connected to one of the bio-sensors that is generating an analog signal received by the first, second, or third section of the plurality of analog inputs, the input sensor detector/decoder successively selecting a current connected input in the plurality of analog inputs for conversion;
an Analog Front-End (AFE) that amplifies and filters the current connected input to generate a pre-processed analog signal;
an analog-to-digital converter (ADC) that converts the pre-processed analog signal to a digital value, wherein higher-precision digital values having more digital bits are generated for the third section of the plurality of analog inputs than for the first section of the plurality of analog inputs, wherein higher-precision digital values having more digital bits are generated for the third section of the plurality of analog inputs than for the second section of the plurality of analog inputs;
a microcontroller that receives the digital value from the ADC and formats the digital value for wireless transmission;
a bypass switch, coupled around the AFE, for bypassing another current connected input from the input sensor detector/decoder around the AFE and directly connecting the current connected input to the ADC as an input signal to the ADC in place of the pre-processed analog signal without processing by the AFE when the bypass switch is closed;
wherein the microcontroller activates the bypass switch to close when the input sensor detector/decoder indicates that the current connected input is from the first section of the plurality of analog inputs, and
a wireless transmitter that wirelessly transmits the digital value formatted by the microcontroller;
wherein inputs of the third section of the plurality of analog inputs are grounded when not connected to a third bio-sensor;
wherein a disease is diagnosed when the first section and third section of the plurality of analog inputs are grounded and the first and second biological molecules are detected, and wherein another health condition is diagnosed when the first section of the plurality of analog inputs is grounded and the third section of the plurality of analog inputs is connected to the third bio-sensor and the first and second biological molecules are detected,
whereby analog inputs in the first, second, and third section of the plurality of analog inputs are auto-detected.

2. The bio-sensing processor chip of claim 1 wherein the microcontroller configures the ADC to convert analog signals of the plurality of analog signals to L-bit digital values for analog inputs identified by the input sensor detector/decoder as being from the first section of the plurality of analog inputs;
wherein the microcontroller configures the ADC to convert analog signals of the plurality of analog signals to M-bit digital values for analog inputs identified by the input sensor detector/decoder as being from the second section of the plurality of analog inputs;
wherein the microcontroller configures the ADC to convert analog signals of the plurality of analog signals to N-bit digital values for analog inputs identified by the input sensor detector/decoder as being from the third section of the plurality of analog inputs;
wherein L, M, and N are whole numbers, and M is larger than L, and N is larger than M;
whereby the ADC is auto-configured for different conversion resolutions for bio-sensors connected to different sections of the plurality of analog inputs.

3. The bio-sensing processor chip of claim 1 further comprising:
a wireless receiver that wirelessly receives messages from an external device that receives the digital value;
an energy harvester, coupled to the wireless receiver, for generating an internal power-supply voltage from transmission energy from the external device.

4. The bio-sensing processor chip of claim 3 further comprising:
a battery detector, coupled to a power-supply pad of the bio-sensing processor chip, the battery detector signaling a battery mode when an external power-supply voltage is externally applied to the power-supply pad.

5. The bio-sensing processor chip of claim 4 wherein the battery detector further comprises:
a comparator that compares the power-supply pad to the internal power-supply voltage and signals the battery mode when the power-supply pad has a voltage greater than the internal power-supply voltage.

6. The bio-sensing processor chip of claim 4 further comprising:
 a power-switch controller that connects the external power-supply voltage from the power-supply pad to a local power-supply node when the battery detector signals the battery mode, and that connects the internal power-supply voltage generated by the energy harvester to the local power-supply node when the battery detector does not signal the battery mode;
 wherein the local power-supply node provides power to the ADC, the microcontroller, the input sensor detector/decoder, and the wireless transmitter;
 whereby local power is auto-configured.

7. The bio-sensing processor chip of claim 2 wherein L is 12 bits or less, and N is at least 20 bits.

8. The bio-sensing processor chip of claim 4 wherein the wireless transmitter is a Near-Field Communication (NFC) transmitter and the wireless receiver is a NFC receiver;
 wherein the external device is within 20 centimeters of the bio-sensing processor chip when messages are wirelessly received.

9. The bio-sensing processor chip of claim 8 further comprising:
 a BLE/Wifi transmitter that wirelessly transmits the digital value formatted by the microcontroller;
 a BLE/Wifi receiver that wirelessly receives messages from the external device;
 wherein the microcontroller activates the BLE/Wifi transmitter and disables the wireless transmitter when the external device is paired for WiFi communication.

10. The bio-sensing processor chip of claim 4 wherein the microcontroller further comprises:
 a Universal Asynchronous Receiver Transmitter (UART) for formatting the digital values from the ADC for wireless transmission as a serial bitstream.

11. The bio-sensing processor chip of claim 4 wherein unconnected inputs in the plurality of analog inputs are connected to a ground;
 wherein the input sensor detector/decoder compares an input in the plurality of analog inputs to the ground and indicates that the input is a connected input when the input has a voltage above the ground.

12. An auto-configurable bio-sensing system comprising:
 a bio-sensing processor having first analog inputs, second analog inputs, and third analog inputs, the bio-sensing processor comprising;
 an input detector that detects when bio-sensors are connected to the first analog inputs, to the second analog inputs, or to the third analog inputs;
 a first bio-sensor having a nano-wire with receptors bonded thereon for detecting a first biological molecule, the first bio-sensor driving one of the inputs in the second analog inputs;
 a second bio-sensor having a nano-wire with receptors bonded thereon for detecting a second biological molecule, the second bio-sensor driving another one of the inputs in the second analog inputs;
 an analog-to-digital converter (ADC) that converts an ADC analog input to a digital value, wherein the digital value has L, N, or M bits of precision, wherein L, M, and N are whole numbers, and N is at least 20 and L is no more than 12, and M is between L and N;
 an Analog Front-End (AFE) that amplifies and filters an AFE input to generate an AFE output;
 wherein the AFE input receives the second analog inputs, and third analog inputs, and wherein the ADC analog input receives the AFE output;
 a Universal Asynchronous Receiver Transmitter (UART) for formatting the digital value from the ADC for wireless transmission;
 a near-field wireless transceiver for sending formatted digital values to an external device and for receiving messages from the external device;
 wherein the external device is sufficiently close to the near-field wireless transceiver for near-field energy harvesting wherein a harvested power-supply voltage is generated from the messages from the external device;
 a power controller that detects when an external power source is available and connects the external power source to provide power to the ADC, AFE, and UART when the external power source is detected, and for connecting the harvested power-supply voltage to provide power to the ADC, AFE, and UART when the external power source is not detected, and
 a microcontroller that receives input configuration information from the input detector, the microcontroller activating the ADC to convert the first analog inputs to L-bit digital values, the second analog inputs to M-bit digital values, and the third analog inputs to N-bit digital values;
 wherein the microcontroller causes the AFE output to drive the ADC analog input when an analog signal from the third analog inputs is connected to the AFE input;
 a bypass switch, activated by the microcontroller to connect an analog signal from the first analog inputs to the ADC analog input, wherein the first analog inputs bypass the AFE when the first analog inputs are active;
 wherein inputs of the third analog inputs are grounded when not connected to a third bio-sensor;
 wherein a disease is diagnosed when the first analog inputs and third analog inputs are grounded and the first and second biological molecules are detected, and wherein another health condition is diagnosed when the first analog inputs is grounded and the third analog inputs is connected to the third bio-sensor and the first and second biological molecules are detected,
 whereby the microcontroller adjusts resolution of the ADC for different analog inputs detected by the input detector.

13. The auto-configurable bio-sensing system of claim 12 wherein when the external power source is not detected, the microcontroller converts each analog input only once;
 wherein when the external power source is detected, the microcontroller converts each analog input continuously,
 whereby one-shot measurements are made when the external power source is not detected.

14. The auto-configurable bio-sensing system of claim 12 further comprising:
 the third bio-sensor having a nano-wire with receptors bonded thereon for detecting a third biological molecule, the third bio-sensor driving one of the analog inputs in the second analog inputs;
 wherein when inputs of the first analog inputs and of the third analog inputs are grounded
 the disease is more accurately diagnosed when the first, second, and third biological molecules are detected.

15. The auto-configurable bio-sensing system of claim 12 further comprising:
 a fourth bio-sensor for measuring a patient's temperature, the fourth bio-sensor driving one of the analog inputs in the first analog inputs;

a fifth bio-sensor for measuring saturated oxygen levels in the patient's blood, the fifth bio-sensor driving one of the analog inputs in the third analog inputs;

a sixth bio-sensor that measures electrical signals created by a the patient's heart, the sixth bio-sensor driving one of the analog inputs in the third analog inputs;

a battery providing the external power source;

wherein when inputs of the second analog inputs are grounded the patient's vital signs are continually monitored by the fourth, fifth, and sixth bio-sensors.

16. The auto-configurable bio-sensing system of claim 15 further comprising:

a far-field wireless transceiver for sending formatted digital values to the external device and for receiving messages from the external device using Radio-Frequency (RF) transmissions that are too weak to permit energy harvesting;

wherein the microcontroller disables the far-field wireless transceiver when the power controller is unable to detect the external power source, whereby far-field transmissions are disabled when no external power source is available.

17. A bio-sensing processor Integrated Circuit (IC) comprising:

first inputs for receiving analog inputs from bio-sensors having a low precision;

second inputs for receiving analog inputs from bio-sensors having a medium precision;

third inputs for receiving analog inputs from bio-sensors having a high precision;

wherein the second inputs receives an analog input from a first bio-sensor having a nano-wire with receptors bonded thereon for detecting a first biological molecule;

a second bio-sensor having a nano-wire with receptors bonded thereon for detecting a second biological molecule, the second bio-sensor driving one of the analog inputs in the second inputs;

an input sensor detector for detecting grounded inputs not connected to one of the bio-sensors and for detecting active inputs connected to a respective bio-sensor in the first inputs, the second inputs, and the third inputs;

an input sensor decoder for selecting as a current analog input from among active inputs detected in the first inputs, the second input, and the third inputs;

an Analog Front End (AFE) for amplifying and filtering the current analog input selected by the input sensor decoder to generate a filtered analog signal;

a bypass switch for not amplifying and not filtering the current analog input and not generating the filtered analog signal when the current analog input is from one of the first inputs;

an analog-to-digital converter for converting the filtered analog signal to a digital value having X significant bits, wherein X is no more than 12 when the current analog input is one of the analog inputs in the first inputs, wherein X is at least 20 when the current analog input is one of the analog inputs in the third inputs, and wherein X is an intermediate value between 12 and 20 when the current analog input is one of the analog inputs in the second inputs;

a Universal Asynchronous Receiver Transmitter (UART) for formatting the digital value in a transmission packet;

a Near Field Communication (NFC) transmitter for transmitting the transmission packet to an external device;

a Near Field Communication (NFC) receiver for receiving messages from the external device;

an energy harvester for generating a harvested power-supply voltage by extracting energy from the messages received from the external device;

an external battery detector for detecting an external battery or power source and signaling a battery mode when the external battery or power source is detected;

a power switch controller for powering the analog-to-digital converter, the UART, and the input sensor decoder from the harvested power-supply voltage when no external battery or power source is detected; and a microcontroller for converting only once each current analog input from among active inputs detected in the first inputs, the second inputs, and the third inputs when the external battery or power source is not detected;

wherein analog inputs of the third inputs are grounded when not connected to a third bio-sensor;

wherein a disease is diagnosed when the first inputs and third inputs are grounded and the first and second biological molecules are detected, and wherein another health condition is diagnosed when the first inputs is grounded and the third inputs is connected to the third bio-sensor and the first and second biological molecules are detected.

18. The bio-sensing processor Integrated Circuit (IC) of claim 17 wherein the external battery detector further comprises:

a comparator for comparing a power-supply pad to an internal power-supply voltage and signaling the battery mode when the power-supply pad has a voltage greater than the internal power-supply voltage.

* * * * *